(12) United States Patent
Naruoka

(10) Patent No.: US 6,300,147 B1
(45) Date of Patent: Oct. 9, 2001

(54) METHOD OF INSPECTING SEMICONDUCTOR SUBSTRATE

(75) Inventor: Hideki Naruoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/603,918

(22) Filed: Jun. 26, 2000

(30) Foreign Application Priority Data

Aug. 4, 1999 (JP) .................................................. 11-221000

(51) Int. Cl.$^7$ .............................. H01L 21/66; H01L 21/31
(52) U.S. Cl. ............................... 438/14; 438/22; 438/768; 438/770
(58) Field of Search .............................. 438/14, 22, 766, 438/769, 770, 791, 961, 260, 585, 216

(56) References Cited

U.S. PATENT DOCUMENTS

| 5,228,878 | * | 7/1993 | Komatsu ................................. 445/24 |
| 5,735,949 | * | 4/1998 | Mantl et al. ............................. 117/8 |
| 5,780,342 | * | 7/1998 | Wang ..................................... 438/260 |
| 5,851,892 | * | 12/1998 | Lojek et al. ........................... 438/305 |
| 5,972,804 | * | 10/1999 | Tobin et al. ........................... 438/786 |
| 6,040,207 | * | 3/2000 | Gardner et al. ....................... 438/216 |

FOREIGN PATENT DOCUMENTS

| 59-34629 | 2/1984 | (JP) . |
| 7-94688 | 4/1995 | (JP) . |

* cited by examiner

Primary Examiner—Michael Lebentritt
(74) Attorney, Agent, or Firm—Oblon, Spivak, McClelland, Maier & Neustadt, P.C.

(57) ABSTRACT

An SOI substrate having a silicon layer formed on an embedded oxide layer is prepared at a step ST11. An exposed surface of the silicon layer is thermally oxidized for forming a thermal oxide film at a step ST12. The thermal oxide film, enclosing a defect in the silicon layer, is formed in a shape on or to which the defect is reflected or transferred. At this time, thermal oxidation is so executed that the transferred part of the thermal oxide film is in contact with the embedded oxide layer. The SOI substrate is dipped in a hydrofluoric acid solution at a step ST13. Thus, the thermal oxide film is removed while the embedded oxide layer is eroded through the part in contact with the thermal oxide film. According to this inspection method ST10, the defect is reliably transferred to the embedded oxide layer through the thermal oxidation step ST12, whereby it is possible to evaluate an inner defect undetectable/unevaluative by a conventional inspection method. Thus, the defect of the silicon layer is inspected/evaluated for obtaining an SOI substrate of high quality and improving the manufacturing yield of a semiconductor device.

7 Claims, 9 Drawing Sheets

METHOD OF INSPECTING SEMICONDUCTOR SUBSTRATE

BACKGROUND OF THE INVENTION

1. Field of the Invention

The present invention relates to a method of inspecting a crystal defect or the like in a surface semiconductor layer of an SOI (silicon on insulator or semiconductor on insulator) substrate serving as a semiconductor substrate.

2. Description of the Background Art

An SOI substrate is generally manufactured by a bonding method or an SIMOX (separation by implanted oxygen) method.

In general, a surface silicon layer of an SOI substrate manufactured by the bonding method (hereinafter also referred to as "bonding SOI substrate") has defects such as voids (hollow defects) referred to as COPs (crystal originated particles) and an oxygen precipitate intrinsic to a bulk substrate employed as the raw material as well as an oxygen precipitate and stacking faults induced in steps of manufacturing the SOI substrate.

In an SOI substrate manufactured by the SIMOX method (hereinafter also referred to as "SIMOX substrate"), on the other hand, thin regions or surface depressions, for example, may be caused on the surface silicon layer in manufacturing steps in addition to COPs intrinsic to a silicon substrate employed as the raw material. When carrying out an oxygen implantation step on the surface silicon layer of the silicon substrate still having particles and the like, portions located under such particles and the like are reduced in thickness as compared with the remaining portions of the same layer since the depth of oxygen ions implanted into these portions is smaller than that in the remaining portions. Further, the amount of the oxygen ions implanted into the portions located under the particles and the like is also smaller than that in the remaining portions. When performing heat treatment after oxygen implantation for forming an embedded oxide (silicon oxide) layer, therefore, the amounts of expansion of the silicon oxide vary with the different amounts of oxygen implantation and the regions located under the particles into which oxygen is implanted in a smaller amount, i.e., in which the silicon oxide expands by a smaller amount, are depressed with respect to the peripheral regions.

In addition to the aforementioned inconveniences caused in the surface silicon layer itself in the initial stage, inconveniences such as an oxygen precipitate and stacking faults resulting from each manufacturing process are induced in the surface silicon layer after the SOI substrate is introduced into the manufacturing steps.

A hydrofluoric acid dipping method (HF dipping method) is widely employed as a method of inspecting such inconveniences of the surface silicon layer. The conventional inspection method is now described. FIG. 14A is a longitudinal sectional view of an SOI substrate 1 not yet subjected to hydrofluoric acid dipping. As shown in FIG. 14A, the SOI substrate 1 comprises a substrate support part 30, an embedded oxide layer 20 formed on the support part 30 and a surface silicon layer 10 formed on a surface 20S of the embedded oxide layer 20 opposite to the support part 30. FIGS. 14A and 14B typically illustrate COPs 51a to 51d (hereinafter also generically referred to as "COPs 51"), an oxygen precipitate 52 and a locally thin region 53 as defects 50 which are initial inconvenient portions of the silicon layer 10.

The SOI substrate 1 in the state shown in FIG. 14A is dipped in a hydrofluoric acid solution. Then, the hydrofluoric acid solution erodes the embedded oxide layer 20 through the COP 51a reaching the aforementioned surface 20S from an exposed surface 10S of the surface silicon layer 10, as shown in FIG. 14B. Thus, an embedded oxide layer 21 having an eroded part 21a under the COP 51a is defined. The density etc. of the COP 51a in the SOI substrate 1 can be recognized by observing the eroded part 21a. Thus, the hydrofluoric acid dipping method enables visual inspection of an SOI substrate with an optical microscope or the like by visualizing defects of sizes generally unobservable with an optical microscope.

The hydrofluoric acid dipping method, which visualizes the defect of the surface silicon layer 10 by eroding the embedded oxide layer 20 with hydrofluoric acid, is applicable to a part such as the COP 51a shown in FIG. 14A where the hydrofluoric acid solution can reach the embedded oxide layer 20, i.e., a part not formed with the surface silicon layer 10 but exposing the embedded oxide layer 20. In other words, only a defect reaching the surface 20S of the embedded oxide layer 20 from the exposed surface 10S of the surface silicon layer 10 can be detected with the hydrofluoric dipping method. More specifically, the hydrofluoric acid dipping method is inapplicable to inspection/evaluation of defects (hereinafter also generically referred to as "inner defects 50N") such as (I) the COP 51b not reaching the surface 20S, (II) the COP 51c not reaching the surface 10S, (III) the COP 51d and the oxygen precipitate 52 reaching neither of the surfaces 10S and 20S and (IV) the thin region 53 shown in FIG. 14A.

When forming a semiconductor element or the like on the surface silicon layer 10 in general, the thickness of the surface silicon layer 10 is reduced into a level suitable for the semiconductor element before the same is introduced into the manufacturing steps. If the inner defects 50N can be inspected before reducing the thickness of the surface silicon layer 10, therefore, reduction of the manufacturing yield can be prevented beforehand. In the hydrofluoric acid dipping method which is a conventional inspection method, however, the inner defects 50N of the SOI substrate 1 cannot be sufficiently grasped in advance of introduction into the manufacturing steps. Even if the SOI substrate 1 is determined as non-defective through inspection by the hydrofluoric acid dipping method before introduction into the manufacturing steps, therefore, it is impossible to avoid such a situation that the inner defects 50N appear after reducing the thickness of the surface silicon layer 10 to remarkably lower the manufacturing yield.

SUMMARY OF THE INVENTION

According to a first aspect of the present invention, a method of inspecting a semiconductor substrate comprising steps of (a) preparing a semiconductor substrate comprising a dielectric layer and a semiconductor layer formed on the dielectric layer, whose surface opposite to the dielectric layer is exposed, (b) thermally oxidizing the exposed surface of the semiconductor layer for forming a thermal oxide film, (c) etching the thermal oxide film and (d) etching the dielectric layer through the thermal oxide film perforated in the step (c).

According to the first aspect, the thermal oxide film formed in the step (b) has a shape reflecting a defect when the semiconductor layer is defective, and the defect is transferred to the thermal oxide film and the semiconductor layer. The transferred part of the thermal oxide film can be opened by etching for exposing the dielectric layer in the step (c) by executing the aforementioned thermal oxidation so that the transferred part of the thermal oxide film comes into contact with the dielectric layer. The aforementioned defect can be transferred to the dielectric layer by eroding the dielectric layer through the aforementioned opening in the step (d). According to this inspection method, therefore, not only a COP reaching the dielectric layer from the exposed surface of the semiconductor layer but also an inner defect undetectable by the conventional hydrofluoric acid dipping method can be visualized and detected.

Consequently, the level of quality control can be improved as compared with the case of applying the conventional inspection method by utilizing this inspection method for quality control of a semiconductor substrate, for obtaining a semiconductor substrate of high quality. Further, the manufacturing yield and reliability of a semiconductor device can be improved by employing the semiconductor substrate of high quality obtained in this manner.

According to a second aspect of the present invention, the step (c) further comprises a step (c-1) of etching a thermal oxidation-induced defect formed in the step (b), and the step (d) further comprises a step (d-1) of etching the dielectric layer through the thermal oxide film perforated in the step (c-1).

According to the second aspect, a thermal oxidation-induced defect such as an oxygen precipitate, for example, formed in the thermal oxidation step (b) can be visualized for inspection/evaluation. At this time, inspection/evaluation of the semiconductor substrate can be executed at the level of actual manufacturing steps by setting the thermal oxidation in the step (b) to conditions suitable for the actual manufacturing steps, for transferring the thermal oxidation-induced defect to the dielectric layer and previously grasping this defect. Consequently, a semiconductor substrate of high quality and a semiconductor device improved in manufacturing yield and reliability can be obtained similarly to the method according to the first aspect.

According to a third aspect of the present invention, the dielectric layer consists of an oxide of a semiconductor material forming the semiconductor layer.

According to the third aspect, the dielectric layer consists of the oxide forming the semiconductor layer, whereby the same etchant can be employed in the steps (b) and (c) for continuously carrying out these steps (b) and (c).

According to a fourth aspect of the present invention, the method of inspecting a semiconductor substrate further comprises a step (e) of performing heat treatment on the semiconductor substrate in advance of the step (c).

According to the fourth aspect, the aforementioned defect can be grown and more reliably transferred to the semiconductor layer and the dielectric layer by carrying out the step (e) after the aforementioned thermal oxidation step (b). Therefore, any one of the effects according to the first to third aspects can be reliably attained.

According to a fifth aspect of the present invention, the step (c) further comprises a step (c-2) of etching a heat treatment-induced defect formed in the step (e), and the step (d) further comprises a step (d-2) of etching the dielectric layer through the thermal oxide film perforated in the step (c-2).

According to the fifth aspect, a heat treatment-induced defect such as an oxygen precipitate, for example, induced in the heat treatment can be visualized for inspection/evaluation. At this time, inspection/evaluation of a semiconductor device can be executed at the level of actual manufacturing steps by setting the heat treatment in the step (e) to conditions suitable for the actual manufacturing steps, for previously grasping the heat treatment-induced defect. Consequently, a semiconductor substrate of high quality and a semiconductor device improved in manufacturing yield and reliability can be obtained similarly to the method according to the first aspect.

According to a sixth aspect of the present invention, a method of inspecting a semiconductor substrate comprises steps of (a) preparing a semiconductor substrate comprising a dielectric layer and a semiconductor layer formed on the dielectric layer, whose surface opposite to the dielectric layer is exposed, (b) performing heat treatment on the semiconductor substrate, (c) performing isotropic etching on the exposed surface of the semiconductor layer and (d) etching the dielectric layer through the semiconductor layer perforated in the step (c).

According to the sixth aspect, the surface of the semiconductor layer remaining after the isotropic etching in the step (b) has an irregular shape reflecting a defect when the semiconductor layer is defective and the defect is transferred to the semiconductor layer. The part of the dielectric layer corresponding to the defective part can be eroded in the step (d) by executing the aforementioned isotropic etching so that a concave portion of the transferred part reaches the dielectric layer to expose the dielectric layer, for transferring the aforementioned defect to the dielectric layer. According to this inspection method, therefore, not only a COP reaching the dielectric layer from the exposed surface of the semiconductor layer but also an inner defect undetectable by the conventional hydrofluoric acid dipping method can be visualized and detected.

Consequently, the level of quality control can be improved as compared with the case of applying the conventional inspection method by utilizing this inspection method for quality control of a semiconductor substrate, for obtaining a semiconductor substrate of high quality. Further, the manufacturing yield and reliability of a semiconductor device can be improved by employing the semiconductor substrate of high quality obtained in this manner.

According to a seventh aspect of the present invention, the step (c) further comprises a step (c-1) of etching a heat treatment-induced defect formed in the step (b), and the step (d) further comprises a step (d-1) of etching the dielectric layer through the semiconductor layer perforated in the step (c-1).

According to the seventh aspect, a heat treatment-induced defect such as an oxygen precipitate, for example, formed in the heat treatment step (b) can be visualized for inspection/evaluation. At this time, inspection/evaluation of a semiconductor device can be executed at the level of actual manufacturing steps by setting the heat treatment in the step (b) to conditions suitable for the actual manufacturing steps, for previously grasping the heat treatment-induced defect. Consequently, a semiconductor substrate of high quality and a semiconductor device improved in manufacturing yield and reliability can be obtained similarly to the method according to the sixth aspect.

An object of the present invention is to provide a method of inspecting a semiconductor substrate capable of detecting and evaluating an inner defect undetectable/unevaluative in a conventional inspection method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1>

Figure 1:
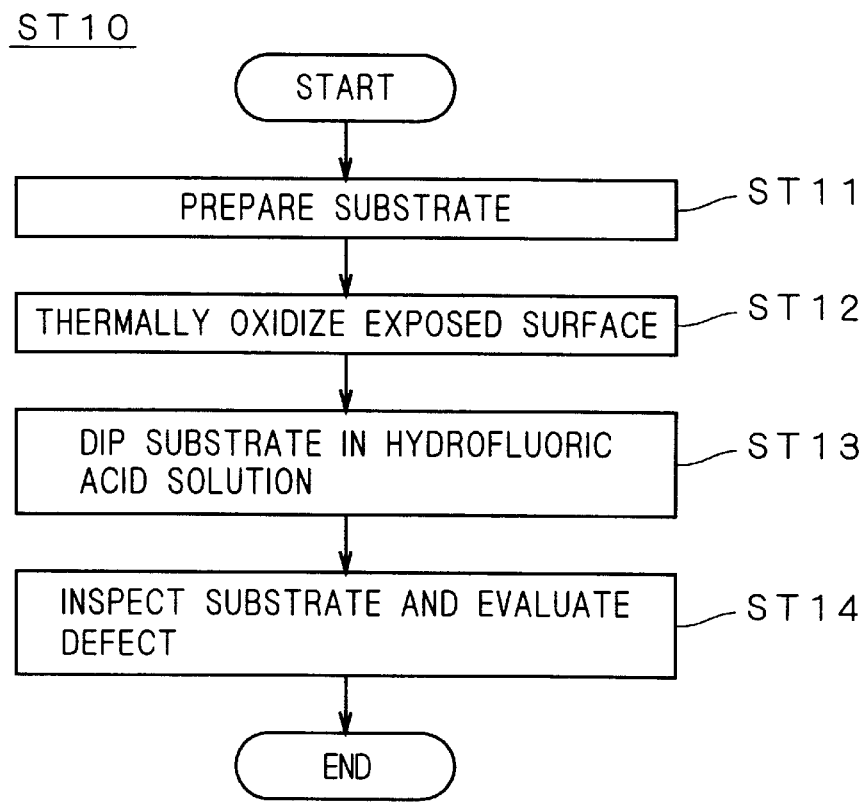
FIG. 1 is a flow chart for illustrating an inspection method according to an embodiment 1 of the present invention.
Figure 3:
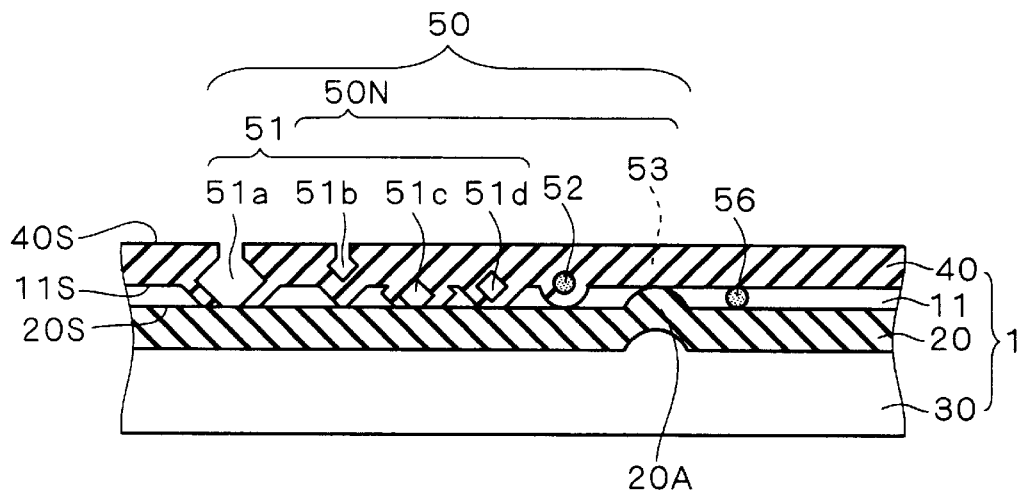
Figure 4:
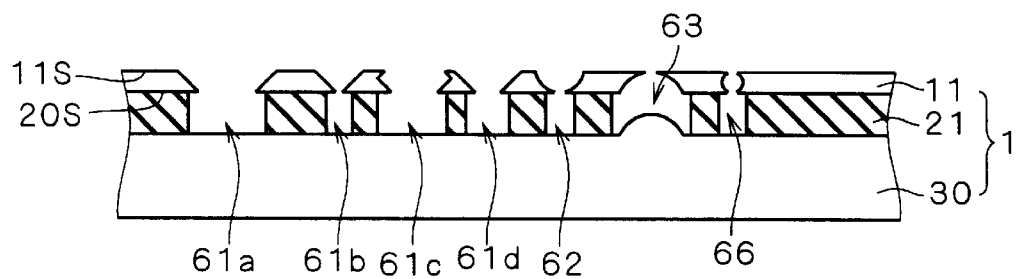

An inspection method or step ST10 for an SOI substrate according to an embodiment 1 of the present invention is described with reference to FIGS. 1 to 4. FIG. 1 is a flow chart of this inspection method ST10, and FIGS. 2 to 4 are typical longitudinal sectional views of an SOI substrate for illustrating this inspection method ST10.

(Step ST11)

Figure 2:
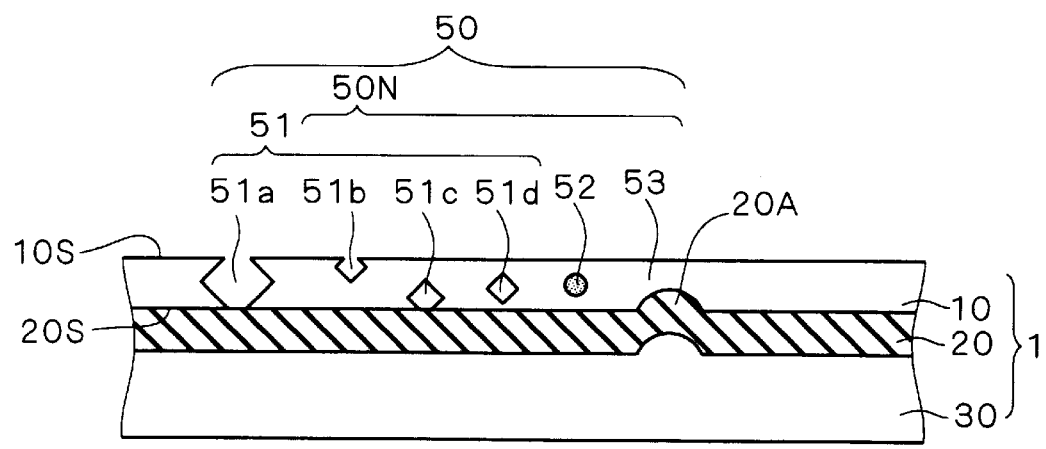
FIGS. 2 to 4 are typical longitudinal sectional views of an SOI substrate for illustrating the inspection method according to the embodiment 1 of the present invention.

First, an SOI substrate (semiconductor substrate) 1 shown in FIG. 2 is prepared. As shown in FIG. 2, the SOI substrate 1 comprises a substrate support part 30, a dielectric layer 20 formed on the support part 30, consisting of a silicon oxide, and a surface silicon layer (hereinafter also referred to simply as "silicon layer") 10 formed on a surface 20S of the dielectric layer 20 opposite to the substrate support part 30. The surface 20S defines the interface between the silicon layer 10 and the dielectric layer 20. A substrate such as a bonding SOI substrate or an SIMOX substrate, for example, manufactured by any of various manufacturing methods is employable as the SOI substrate 1. In the following description, the aforementioned dielectric layer 20 is also referred to as "embedded oxide layer" regardless of the type of the manufacturing method.

FIG. 2 typically illustrates (A) COPs 51 which are hollow defects, (B) an oxygen precipitate 52 and (C) a thin region 53 of the silicon layer 10 resulting from a shallow embedded oxide layer 20A or the like as defects 50 which are initial inconvenient portions of the silicon layer 10 not yet introduced into manufacturing steps. The aforementioned COPs 51 are classified into COPs 51a to 51d. (A-a) The COP 51a is a crystal defect where the embedded oxide layer 20 is not formed with the surface silicon layer 10 thereon but exposed, and the COP 51a reaches the interface 20S from an exposed surface 10S. (A-b) The COP 51b is a crystal defect in contact with the surface 10S without reaching the interface 20S, (A-c) the COP 51c is a crystal defect in contact with the interface 20S without reaching the surface 10S, and (A-d) the COP 51d is a crystal defect in contact with neither of the surfaces 10S and 20S. Here, the number of each defect such as COP 51a is one for simplification of the description. However, the following description can be applicable to the case in which the number of each defect such as COP 51a is plural.

(Step ST12)

Then, the exposed surface 10S of the SOI substrate 1 is thermally oxidized for forming a thermal oxide film 40 shown in FIG. 3. This thermal oxidation can be executed by any of various well-known methods. At this time, a part of the surface silicon layer 10 closer to the interface 20S shown in FIG. 2 remains as a silicon layer 11 shown in FIG. 3. An interface 11S is defined between the silicon layer 11 and the thermal oxide film 40, while a surface 40S of the thermal oxide film 40 opposite to the interface 11S is exposed. The interface 11S is also referred to as "surface 11S of the silicon layer 11 or the thermal oxide film 40". In this thermal oxidation, a thermal oxidation-induced defect 56 such as an oxygen precipitate can be caused in the silicon layer 11.

Particularly as shown in FIG. 3, portions of the thermal oxide film 40 around the defects 51 and 52 are shaped to enclose the defects 51 and 52. Following formation of the thermal oxide film 40, the thin region 53 of the silicon layer 10 (see FIG. 2) is further reduced in thickness or completely thermally oxidized. The thermal oxide film 40 is formed in a shape reflecting the respective ones of the defects 50, and hence an expression "the defects 50 are transferred to the thermal oxide film 40" is employed in the following description. At this time, the silicon layer 11 is also shaped to reflect the defects 50 in correspondence to such transferred parts of the thermal oxide film 40, and hence an expression "the defects 50 are transferred to the silicon layer 10 or 11" is employed.

The following description is made with reference to the thermal oxide film 40 connected with the embedded oxide layer 20 through the defects 50 and 56 as shown in FIG. 3. In further detail, it is assumed that (i) the parts of the thermal oxide film 40 to which the defects 51 and 52 are transferred are in contact with the embedded oxide layer 20, (ii) the thermal oxide film 40 is in contact with the shallow embedded oxide layer 20A and (iii) the thermal oxidation-induced defect 56 substantially extends over the space between the interfaces 11S and 20S.

(Step ST13)

Then, at least the exposed surface 40S side of the SOI substrate 1 in the state shown in FIG. 3 is dipped in a hydrofluoric acid solution at a step ST13. Due to such hydrofluoric acid dipping, the thermal oxide film 40 shown in FIG. 3 is removed while portions of the embedded oxide layer 20 located under and around the transferred parts of the thermal oxide film 40 and under and around the thermal oxidation-induced defect 56 are eroded. Consequently, an embedded oxide layer 21 having eroded parts 61a to 61d, 62, 63 and 66 is formed as shown in FIG. 4. In further detail, hydrofluoric acid first erodes the thermal oxide film 40 up to the aforementioned transferred parts thereof. Thus, the transferred parts of the thermal oxide film 40 are opened to expose the embedded oxide layer 20. Hydrofluoric acid erodes the embedded oxide layer 20 through these openings, thereby forming the aforementioned eroded embedded oxide layer 21.

As understood from FIGS. 2 to 4, the defects 50 and 56 are transferred to the thermal oxide film 40 and the silicon layer 11 at the thermal oxidation step ST12 and thereafter transferred as the eroded parts 61a to 61d, 62, 63 and 66 of the eroded embedded oxide layer 21 at the hydrofluoric acid dipping step ST13.

Japanese Patent Application Laid-Open No. 7-94688 (1995), for example, discloses a technique of thermally oxidizing a surface silicon layer of an SOI substrate for forming a thermal oxide film and thereafter removing the thermal oxide film with a hydrofluoric acid solution in order to flatten an interface between the surface silicon layer and an embedded oxide layer. However, the hydrofluoric acid treatment disclosed in this gazette is merely adapted to remove the aforementioned thermal oxide film and hence it is undesirable to apply this method to the step ST13 as such. This is because the eroded parts 61a to 61d, 62, 63 and 66 to which the defects 50 and 56 are transferred must be sufficiently formed and reliably visualized by setting the dipping time in hydrofluoric acid longer than that capable of completely removing the thermal oxide film 40. When the thermal oxide film 40 is 300 nm and the embedded oxide layer 20 is at least 100 nm in thickness and a hydrofluoric acid solution of 49% is employed, for example, the SOI substrate 1 is subjected to dipping for at least five minutes.

Japanese Patent Application Laid-Open No. 59-34629 (1984) also discloses a technique of forming a thermal oxide film and thereafter removing the thermal oxide film with a hydrofluoric acid solution not for inspection or evaluation of an SOI substrate but as pretreatment for forming an epitaxial layer on a silicon wafer.

(Step ST14)

At a step ST14, the SOI substrate 1 in the state shown in FIG. 4 is visually inspected with an optical microscope, for example, for evaluating the densities etc. of the defects 50 and 56 of the SOI substrate 1. According to this inspection method ST10, the defects 50 and 56 are reliably transferred to the embedded oxide layer 20 and visualized, whereby not only the COP 51a but also inner defects 50N undetectable/unevaluative in the conventional inspection method with hydrofluoric acid dipping can be evaluated.

At this time, the thermal oxidation-induced defect 56 can also be detected/evaluated according to this inspection method ST10, whereby inspection can be executed at the level of actual manufacturing steps by setting the thermal oxidation at the step ST12 to conditions suitable for the actual manufacturing steps. When the thickness of the silicon layer 10 not yet introduced into the manufacturing steps is about 200 nm and the thickness thereof is reduced to about 50 nm when actually forming a semiconductor element or a semiconductor device, for example, the thermal oxidation step ST12 is carried out in a mixed atmosphere of hydrogen and oxygen at a temperature of about 1000° C. for forming a thermal oxide film of about 300 nm in thickness. Thus, the defect 56 induced in the thermal oxidation step included in the manufacturing steps can be previously grasped and utilized for quality control described later.

When forming a MOS transistor with the SOI substrate 1, for example, a thermal oxidation step for forming a gate oxide film, a thermal oxidation step for adjusting/controlling the thickness of the surface silicon layer 10, a thermal oxidation step for forming element isolation and a thermal oxidation step for forming a sacrifice oxide film protecting a prescribed region in various steps can be exemplified as the aforementioned actual manufacturing steps, and thermal oxidation conditions (atmosphere, temperature, time, thickness etc.) identical to those in one of these thermal oxidation steps are applied. A plurality of thermal oxidation conditions in each of the aforementioned thermal oxidation steps may be modeled or simplified to a single condition for application.

Figure 5:
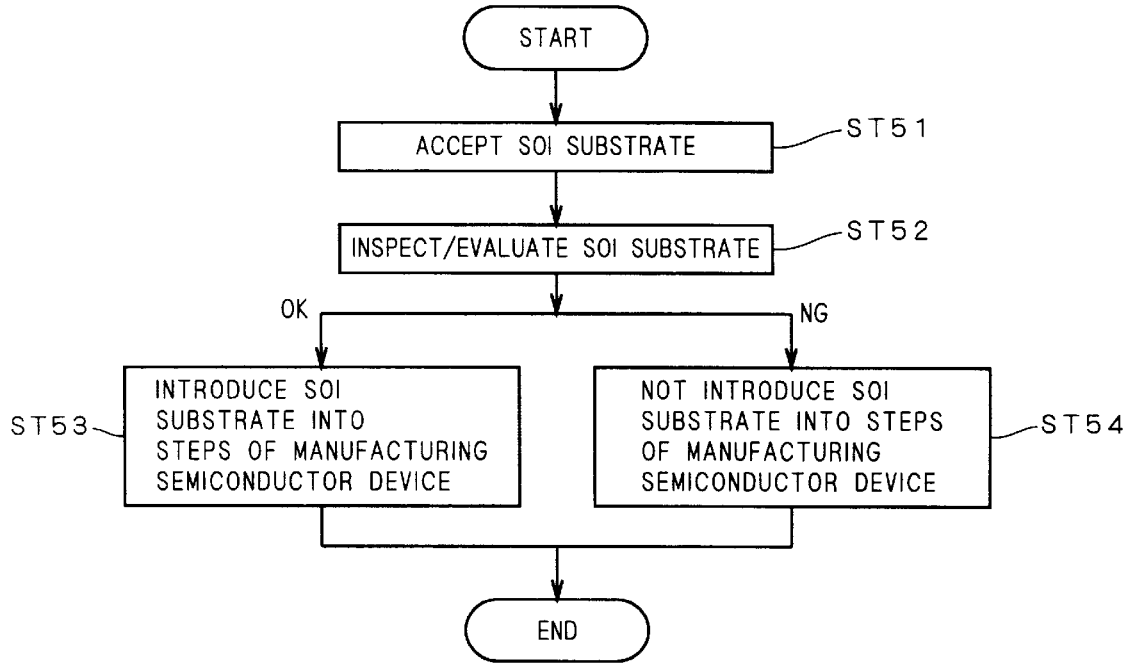
FIG. 5 is a flow chart for illustrating an exemplary quality control method for an SOI substrate to which the inspection method according to the embodiment 1 is applied.

Further, the SOI substrate 1 can be subjected to quality control with this inspection method ST10. When a device maker manufactures a desired semiconductor device with the SOI substrate 1, for example, the inspection method ST10 is applied to some of a plurality of SOI substrates 1 manufactured in the same lot when accepting the SOI substrates 1 or before introducing the same into the manufacturing steps for executing sampling inspection/evaluation (steps ST51 and ST52), as shown in a flow chart of FIG. 5. Thus, information of the defects 50 and 56 in the overall manufacturing lot can be previously grasped from information of the densities etc. of the defects 50 and 56 of each SOI substrate 1 subjected to this inspection. Therefore, quality control of the SOI substrates 1 can be properly performed on the basis of the information for determining whether or not the SOI substrates 1 of the manufacturing lot are suitable for manufacturing semiconductor devices, for example. On the basis of such determination, the SOI substrates 1 of the manufacturing lot are introduced (step ST53) or not introduced (step ST54) into the manufacturing steps for semiconductor devices.

According to such a quality control method, the level of quality control can be improved due to the capability of inspecting/evaluating the defects 5ON and 56 as compared with the case of applying the conventional hydrofluoric acid dipping method. In this case, quality control can be performed in further detail by utilizing previously acquired information of the defects 50 and 56 as a database. Thus, an SOI substrate 1 of high quality can be obtained by employing inspection/evaluation of the defects 50 and 56 by the aforementioned inspection method ST10 as one of quality checking items for the SOI substrate 1.

Consequently, an inconvenience such as reduction of the manufacturing yield, which has been hard to prevent in the conventional inspection and quality control methods, can be avoided by manufacturing a semiconductor device such as a MOS transistor, for example, with the SOI substrate 1 of high quality. In other words, the manufacturing yield can be improved as compared with the case of employing the conventional inspection method, for providing a semiconductor device having high reliability.

Figure 6:
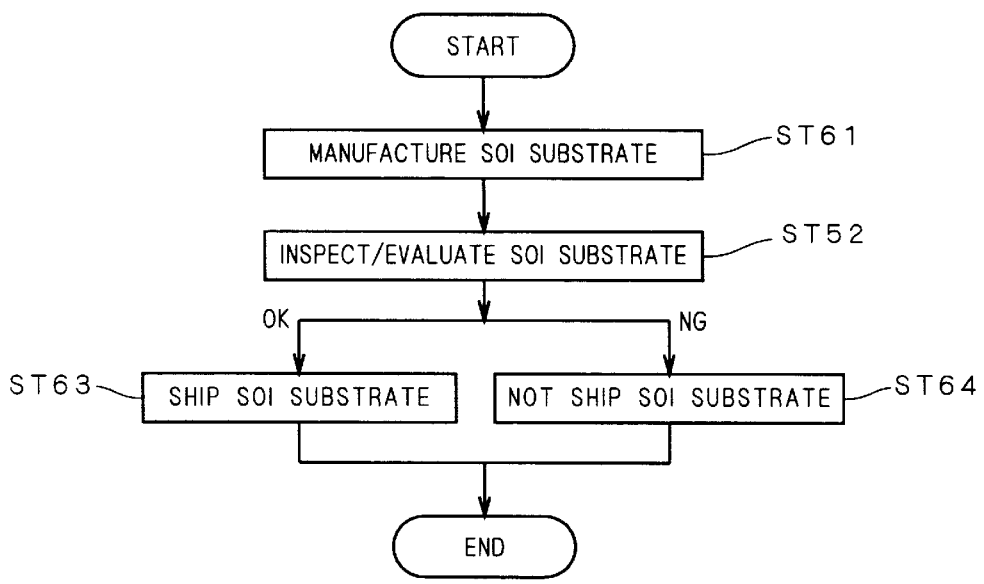
FIG. 6 is a flow chart for illustrating another exemplary quality control method for an SOI substrate to which the inspection method according to the embodiment 1 is applied.

When a maker for SOI substrates or the like introduces the aforementioned inspection method ST10 into the manufacturing steps for the SOI substrate 1, for example, a flow chart shown in FIG. 6 is applicable. After manufacturing the SOI substrate 1, sampling inspection to which the aforementioned inspection method ST10 is applied is executed (steps ST61 and ST62). On the basis of the result of such inspection/evaluation, acceptance/rejection of shipping of SOI substrates 1 in the same manufacturing lot is determined (step ST63 or ST64). Thus, according to this quality control method, the maker of the SOI substrates can deliver SOI substrates 1 of high quality while suppressing and avoiding shipping of low-quality SOI substrates.

A sample substrate may be manufactured before manufacturing all SOI substrates 1 in the step ST61 for applying the step S62 to the sample substrate. When utilizing the result of inspection at the step ST62 as a step control evaluation item, stability of the manufacturing steps for SOI substrates can be controlled.

<Embodiment 2>

Figure 7:
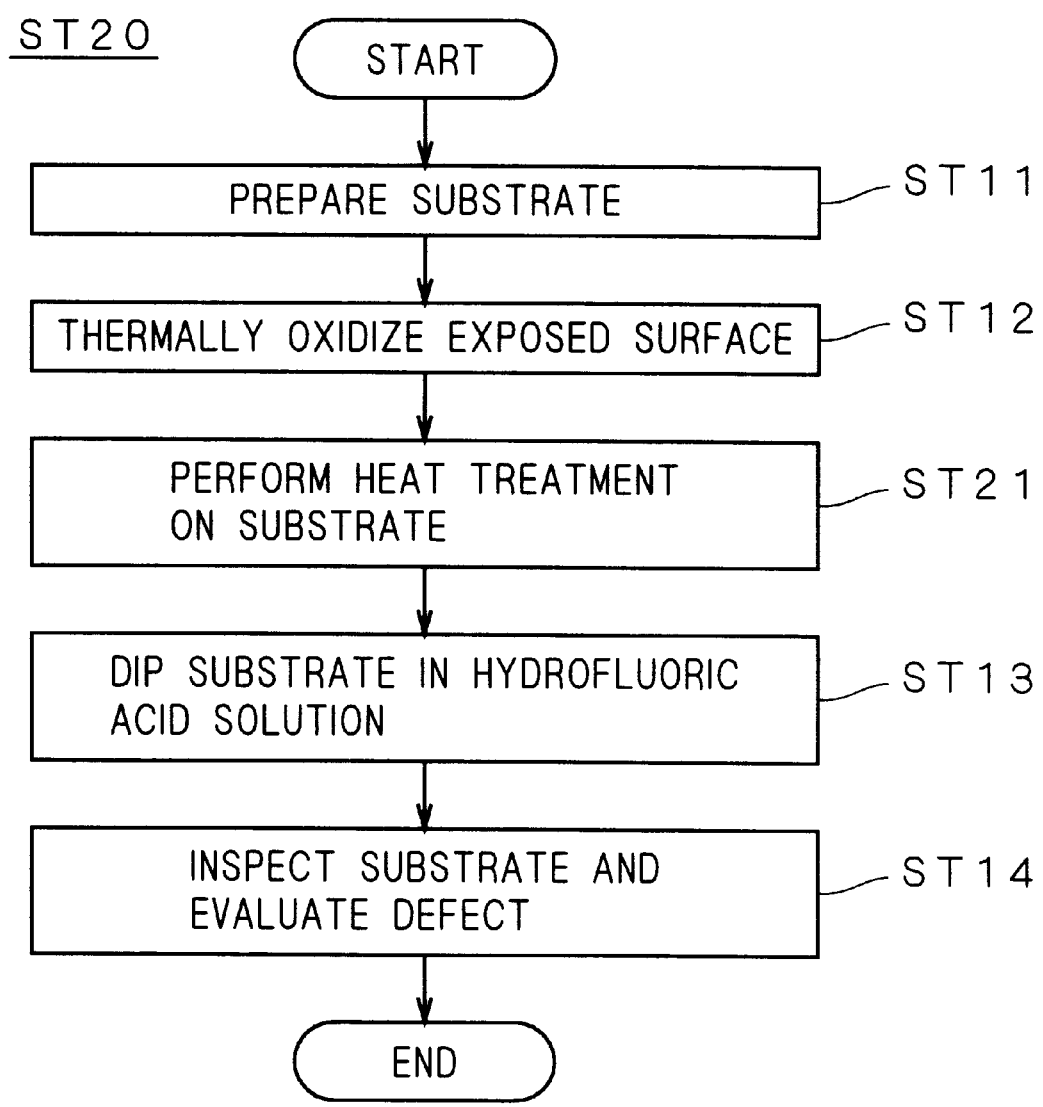
FIG. 7 is a flow chart for illustrating an inspection method according to an embodiment 2 of the present invention.
Figure 8:
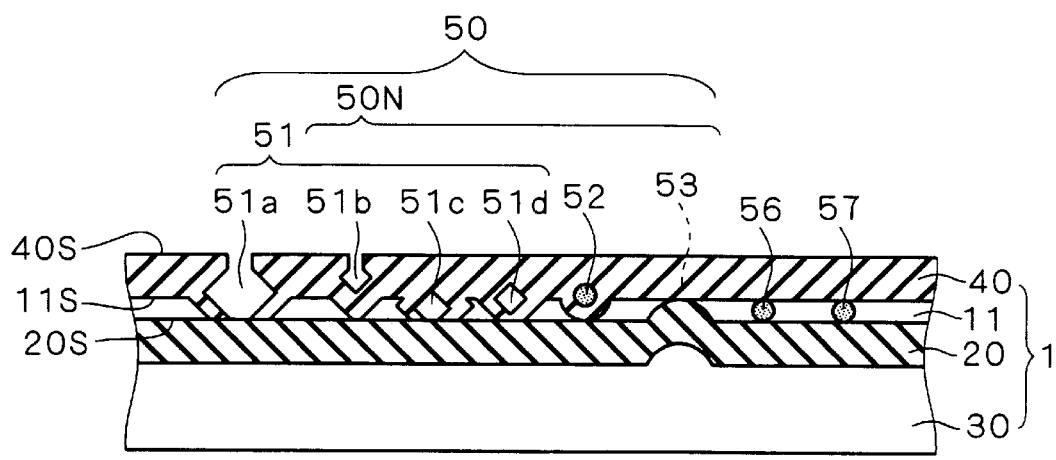
FIGS. 8 and 9 are typical longitudinal sectional views of an SOI substrate for illustrating the inspection method according to the embodiment 2 of the present invention.
Figure 9:
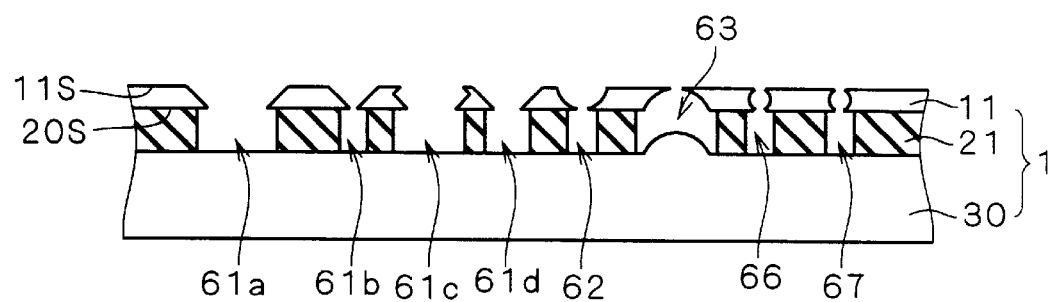

An inspection method or step ST20 for an SOI substrate according to an embodiment 2 of the present invention is now described with reference to FIGS. 7 to 9. FIG. 7 is a flow chart of this inspection method ST20, and FIGS. 8 and 9 are typical longitudinal views of an SOI substrate for illustrating this inspection method ST20. This inspection method ST20, which is characterized in that a step ST21 is added to the already described inspection method ST10 as shown in FIG. 7, is described along the contents of the step ST21. Therefore, components equivalent to the already described ones are denoted by the same reference numerals and redundant description is omitted. This also applies to an embodiment 3 of the present invention described later.

(Steps ST11 and ST12)

First, an SOI substrate 1 of the state shown in FIG. 3 is prepared by carrying out the already described substrate preparation step ST11 and thermal oxidation step ST12.

(Step ST21)

In this step ST21, prescribed heat treatment is performed on the SOI substrate 1 in the state shown in FIG. 3 (see FIG. 8). At this time, a heat treatment-induced defect 57 such as an oxygen precipitate can be caused as shown in FIG. 8. In the following description, the defect 57 extends over a space between both interfaces 11S and 20S while a thermal oxide film 40 and an embedded oxide layer 20 are connected with each other through the heat treatment-induced defect 57.

On the other hand, existing defects 50 and 56 grow or disappear by an annealing effect due to the heat treatment. The thermal oxide film 40 itself also grows. At this time, new connected parts or transferred parts can be caused between the embedded oxide layer 20 and the thermal oxide film 40 due to the growth of the defects 50 and 56 and/or the thermal oxide film 40 although not illustrated in FIG. 8 in detail. Thus, according to this step ST21, the defects 50 and 56 not transferred to a silicon layer 11 in the thermal oxidation step ST12 can be transferred to the silicon layer 11. In other words, the defects 50 initially provided in a silicon layer 10 (see FIG. 2) and the thermal oxidation-induced defect 56 can be more reliably transferred to the silicon layer 11.

(Steps ST13 and ST14)

Then, the already described hydrofluoric acid dipping step ST13 is carried out. Thus, the defects 50, 56 and 57 are visualized as transferred parts 61a to 61d, 62, 63, 66 and 67 of the embedded oxide layer 20 (see FIG. 9). An inspection/evaluation step ST14 is carried out for obtaining information such as the defect density of the SOI substrate 1. According to this inspection method ST20, the defects 50, 56 and 57 can be inspected/evaluated in further detail as compared with the already described inspection method ST10 due to the execution of the aforementioned heat treatment step ST21.

At this time, inspection can be executed at the level of actual manufacturing steps by setting the heat treatment at the step ST21 to conditions suitable for the actual manufacturing steps such as heat treatment conditions in a nitrogen atmosphere at 1150° C. for three hours, for example. Thus, the defect 57 induced in the heat treatment step included in the manufacturing steps can be previously grasped and utilized for quality control.

When manufacturing a MOS transistor with the SOI substrate 1, for example, heat treatment conditions in a heat treatment step carried out after a step of forming a gate oxide film at a temperature equivalent to or exceeding the maximum temperature in the heat history preceding formation of the gate oxide film can be exemplified as the aforementioned heat treatment conditions suitable for the manufacturing steps. More concretely, heat treatment conditions for an annealing step in formation of a source/drain region or a crystal defect repair annealing step can be exemplified and the heat treatment induced defect 57 can be caused by applying heat treatment conditions (atmosphere, temperature, time, film thickness etc.) identical to those for one of the heat treatment steps. A plurality of thermal oxidation conditions in each of the aforementioned thermal oxidation steps may be modeled or simplified to a single condition for application.

The thermal oxidation step ST12 and the heat treatment step ST21 may be carried out in reverse order. In this case, the temperature can be set regardless of the aforementioned maximum temperature.

When applying the inspection method ST20 to quality control of the SOI substrate 1, an SOI substrate 1 of high quality can be obtained similarly to the case of applying the already described inspection method ST10. Further, a semiconductor device improved in manufacturing yield and reliability can be provided by employing the SOI substrate 1 of high quality.

<Embodiment 3>

Figure 10:
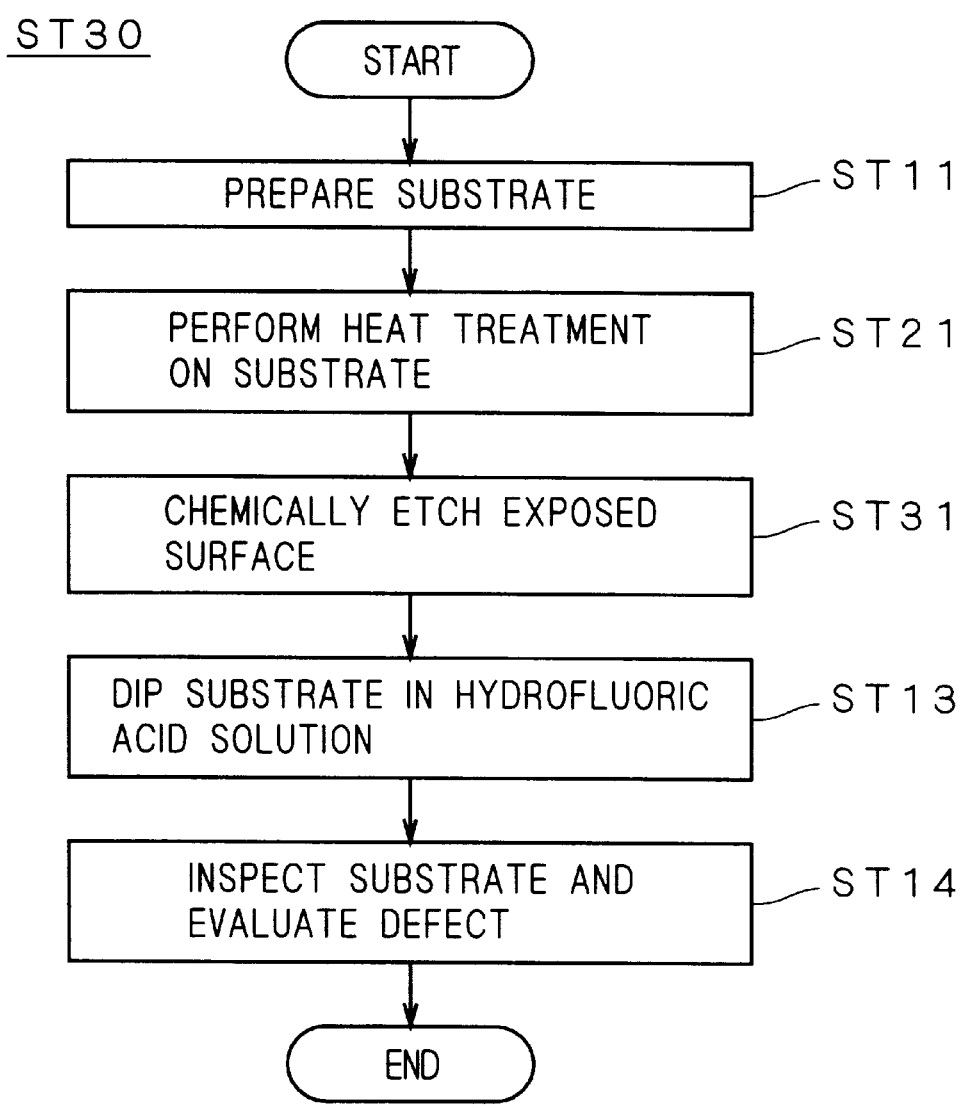
FIG. 10 is a flow chart for illustrating an inspection method according to an embodiment 3 of the present invention.
Figure 11:
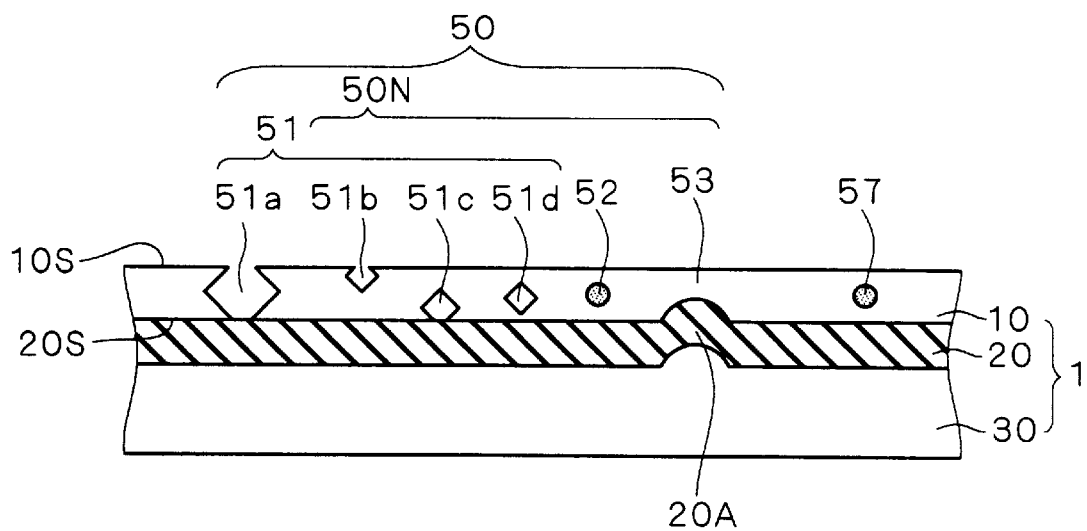
FIGS. 11 to 13 are typical longitudinal sectional views of an SOI substrate for illustrating the inspection method according to the embodiment 3 of the present invention.
Figure 12:
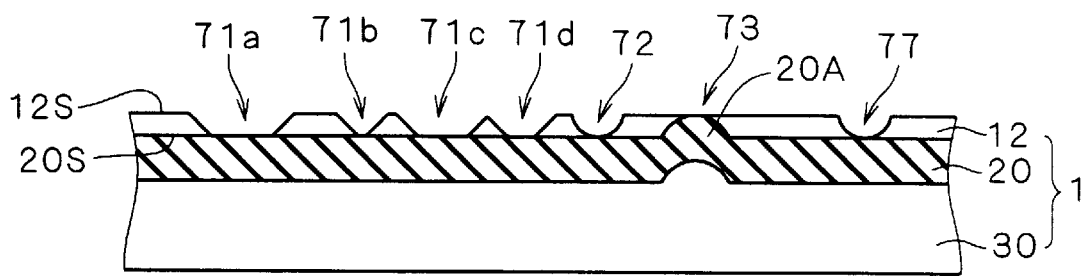
Figure 13:
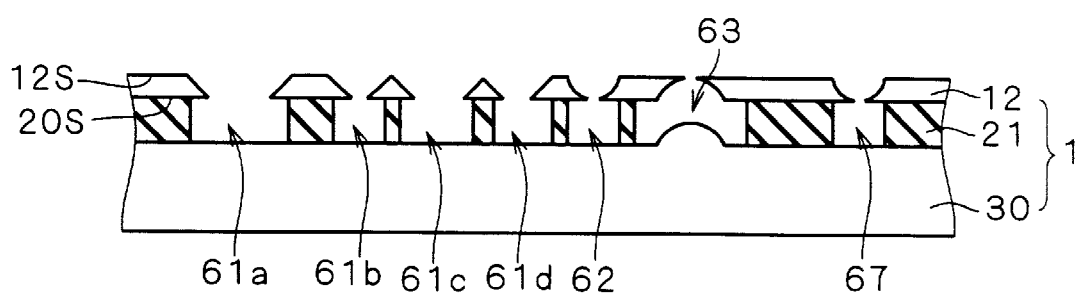
Figure 14A:
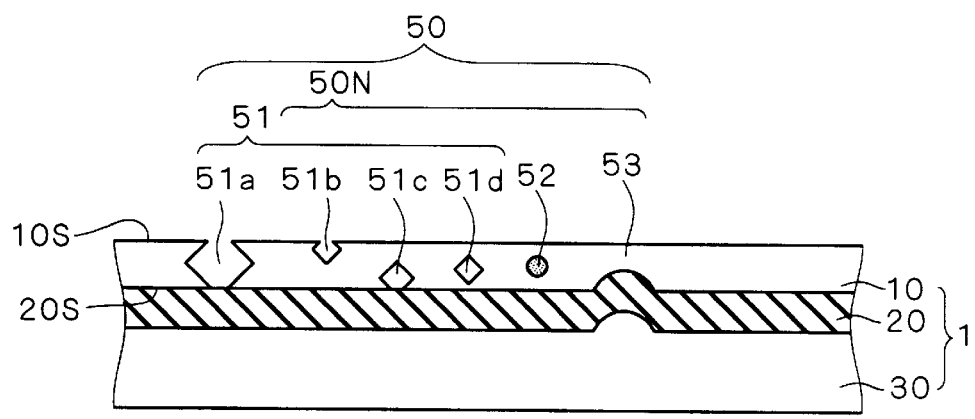
FIGS. 14A and 14B are typical longitudinal sectional views of an SOI substrate for illustrating a conventional inspection method.
Figure 14B:
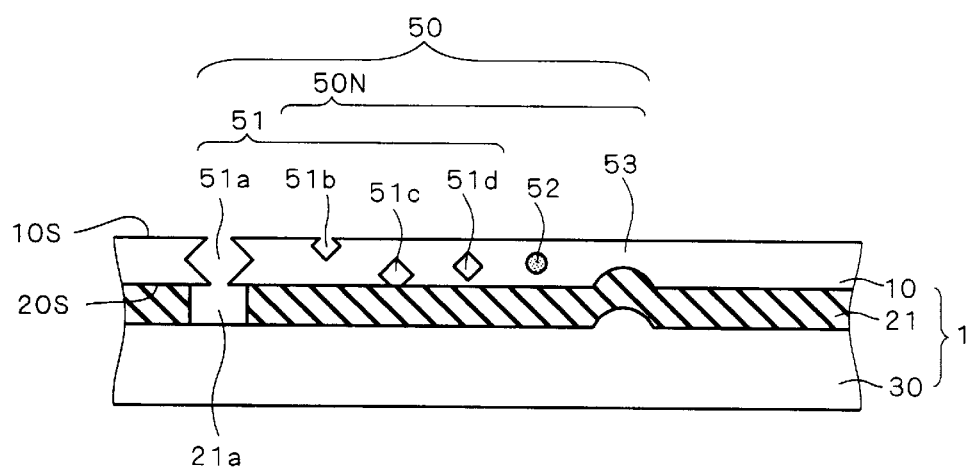

An inspection method or step ST30 for an SOI substrate according to an embodiment 3 of the present invention is now described with reference to FIGS. 10 to 13. FIG. 10 is a flow chart of this inspection method ST30, and FIGS. 11 to 13 are typical longitudinal views of an SOI substrate for illustrating this inspection method ST30. As shown in FIG. 10, the already described step ST21 is added to the already described inspection method ST10 in this inspection method ST30, which comprises a step ST31 in place of the step ST12.

(Step ST11)

First, the already described substrate preparation step ST11 is carried out for preparing an SOI substrate 1 in the state shown in FIG. 2.

(Step ST21)

Then, the already described heat treatment step ST21 is carried out on the SOI substrate 1 in the state shown in FIG. 2. At this time, a heat treatment-induced defect 57 can be caused as shown in FIG. 11. When setting the heat treatment in this step ST21 to conditions suitable for actual manufacturing steps, inspection can be executed at the level of the actual manufacturing steps and the defect 57 induced in the heat treatment step included in the manufacturing steps, for example, can be previously grasped.

(Step ST31)

Thereafter at least an exposed surface 10S side of the SOI substrate 1 in the state shown in FIG. 11 is chemically etched (isotropically etched) in a solution capable of dissolving silicon such as an SC-1 solution, which is a mixed solution of $NH_4OH$, $H_2O$ and $H_2O_2$, for example. Thus, a silicon layer 12 having an exposed surface 12S is formed as shown in FIG. 12. At this time, defects 51a to 51d, 52 and 57 are transferred to the silicon layer 12 as cavities in the exposed surface 12S or local depressed parts 71a to 71d, 72 and 77 of the silicon layer 12. Further, a thin region 53 is transferred as thinner part or an exposed part 73 of a shallow embedded oxide layer 20A. Particularly in this step ST31, etching is so performed as to expose a surface 20S of an embedded oxide layer 20 through the transferred parts 71a to 71d, 72, 73 and 77, thereby perforating the silicon layer 10.

(Steps ST13 and ST14)

Then, the already described hydrofluoric acid dipping step ST13 is carried out. Thus, the embedded oxide layer 20 is eroded through the transferred parts 71a to 71d, 72, 73 and 77, which are openings defined by the aforementioned perforation, so that the defects 50 and 57 can be transferred to the embedded oxide layer 20 and visualized (see FIG. 13). An inspection/evaluation step ST14 is carried out for obtaining information such as the defect density of the SOI substrate 1. According to this inspection method ST30, the defects 50 of the silicon layer 10 and the heat treatment-induced defect 57 can be inspected/evaluated. Further, defects provided in a silicon substrate forming the raw material for the SOI substrate 1 and those caused during the manufacturing steps for the SOI substrate 1 can be inspected/evaluated.

The step ST21 may not be carried out so that only the defects 50 provided in the silicon layer 10 from the initial stage can be inspected/evaluated. When manufacturing the SOI substrate 1 with a silicon substrate whose defect density is previously measured and measuring the density of the defects 50 of the obtained SOI substrate 1, therefore, the density of defects resulting from the manufacturing steps for the SOI substrate 1 can be obtained.

The heat treatment step ST21 and the etching step ST31 may be carried out in reverse order.

When applying the inspection method ST30 to quality control of the SOI substrate 1, an SOI substrate 1 of high quality can be obtained and a semiconductor device improved in manufacturing yield and reliability can be provided similarly to the case of applying the already described inspection method ST10.

When combining the aforementioned inspection methods ST10, ST20 and ST30 in various ways and applying the same to quality control, more detailed information of defects can be obtained. For example, it is possible to avoid inconveniences such as reduction of the yield resulting from each or some of the defects 50, the thermal oxidation-induced defect 56 and the heat treatment-induced defect 57. Therefore, the SOI substrate 1 of high quality can be more reliably acquired while the manufacturing yield and reliability of the semiconductor device can be further improved.

While the embodiments 1 to 3 of the present invention have been described with reference to the aforementioned defects 50, 56 and 57, the above description applies also to various inconvenient parts of a silicon layer which can be visualized with each of the inspection methods ST10, ST20 and ST30, as a matter of course.

Also with respect to a semiconductor substrate having a semiconductor layer and a dielectric layer consisting of different materials in place of the surface silicon layer 10 and the embedded oxide layer 20, in particular, each of the effects of the aforementioned inspection methods ST10 and ST20 can be attained by successively etching an oxide (thermal oxide film) of a semiconductor material forming the semiconductor layer and the dielectric layer. Further, the effect of the aforementioned inspection method ST30 can be attained by perforating the aforementioned semiconductor layer by isotropic etching and etching the aforementioned dielectric layer. In consideration of the point that the aforementioned embodiments 1 to 3 are directed to an SOI substrate of a surface silicon layer/embedded oxide layer structure and the SOI substrate of such a structure is frequently employed at present and the point that the thermal oxide film and the embedded oxide layer, both consisting of silicon oxides, can be continuously etched with a hydrofluoric acid solution serving as a common etchant, it can be said that the aforementioned inspection methods ST10, ST20 and ST30 are extremely practical inspection methods.

While the invention has been shown and described in detail, the foregoing description is in all aspects illustrative and not restrictive. It is therefore understood that numerous modifications and variations can be devised without departing from the scope of the invention.

What is claimed is:

1. A method of inspecting a semiconductor substrate, comprising steps of:
   (a) preparing a semiconductor substrate comprising a dielectric layer and a semiconductor layer formed on said dielectric layer, whose surface opposite to said dielectric layer is exposed;
   (b) thermally oxidizing, said exposed surface of said semiconductor layer for forming a thermal oxide film;
   (c) etching said thermal oxide film; and
   (d) etching said dielectric layer through said thermal oxide film perforated in said step (c).

2. The method of inspecting a semiconductor substrate according to claim 1, wherein
   said step (c) further comprises a step (c-1) of etching a thermal oxidation-induced defect formed in said step (b), and
   said step (d) further comprises a step (d-1) of etching said dielectric layer through said thermal oxide film perforated in said step (c-1).

3. The method of inspecting a semiconductor substrate according to claim 1, wherein
   said dielectric layer consists of an oxide of a semiconductor material forming said semiconductor layer.

4. The method of inspecting a semiconductor substrate according to claim 1, further comprising:
   a step (e) of performing heat treatment on said semiconductor substrate in advance of said step (c).

5. The method of inspecting a semiconductor substrate according to claim 4, wherein
   said step (c) further comprises a step (c-2) of etching a heat treatment-induced defect formed in said step (e), and
   said step (d) further comprises a step (d-2) of etching said dielectric layer through said thermal oxide film perforated in said step (c-2).

6. A method of inspecting a semiconductor substrate comprising steps of:
   (a) preparing a semiconductor substrate comprising a dielectric layer and a semiconductor layer formed on said dielectric layer, whose surface opposite to said dielectric layer is exposed;
   (b) performing heat treatment on said semiconductor substrate;
   (c) performing isotropic etching on said exposed surface of said semiconductor layer; and
   (d) etching said dielectric layer through said semiconductor layer perforated in said step (c).

7. The method of inspecting a semiconductor substrate according to claim 6, wherein
   said step (c) further comprises a step (c-1) of etching a heat treatment-induced defect formed in said step (b), and
   said step (d) further comprises a step (d-1) of etching said dielectric layer through said semiconductor layer perforated in said step (c-1).

* * * * *